(12) United States Patent
Thomas et al.

(10) Patent No.: US 8,801,969 B2
(45) Date of Patent: Aug. 12, 2014

(54) CARBONITRIDE AND CARBIDONITRIDE PHOSPHORS AND LIGHTING DEVICES USING THE SAME

(75) Inventors: Alan Thomas, Yardley, PA (US); Yuanqiang Li, Plainsboro, NJ (US); Yongchi Tian, Princeton Junction, NJ (US)

(73) Assignee: Lightscape Materials, Inc., Princeton, NJ (US)

( * ) Notice: Subject to any disclaimer, the term of this patent is extended or adjusted under 35 U.S.C. 154(b) by 455 days.

(21) Appl. No.: 13/350,383

(22) Filed: Jan. 13, 2012

(65) Prior Publication Data

US 2012/0212122 A1   Aug. 23, 2012

Related U.S. Application Data

(60) Provisional application No. 61/432,931, filed on Jan. 14, 2011.

(51) Int. Cl.
| | | |
|---|---|---|
| *C09K 11/66* | (2006.01) | |
| *C09K 11/61* | (2006.01) | |
| *C09K 11/77* | (2006.01) | |
| *C09K 11/08* | (2006.01) | |
| *H01L 33/50* | (2010.01) | |

(52) U.S. Cl.
CPC ......... *C09K 11/7734* (2013.01); *C09K 11/0883* (2013.01); *H01L 33/502* (2013.01)
USPC ....... 252/301.4 F; 252/301.6 F; 252/301.4 H; 313/503; 257/98

(58) Field of Classification Search
USPC ....... 252/301.4 F, 301.6 F, 301.4 H; 313/503; 257/98
See application file for complete search history.

(56) References Cited

U.S. PATENT DOCUMENTS 7,906,040 B2 *   3/2011   Mitomo et al. ......... 252/301.4 F

* cited by examiner

*Primary Examiner* — Carol M Koslow
(74) *Attorney, Agent, or Firm* — Thomas S. Deibert

(57) ABSTRACT

Disclosed herein is a novel group of carbonitride and carbidonitride phosphors and light emitting devices which utilize these phosphors. In certain embodiments, the inventive phosphors are expressed as follows:

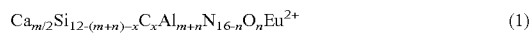

(1)
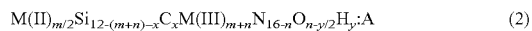 (2)
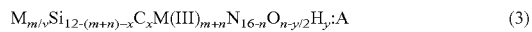 (3)
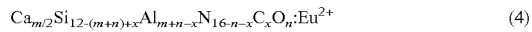 (4)
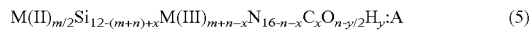 (5)
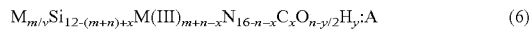 (6)

wherein v is the valence number of M, $0 \le m < 5$, $0 \le n \le 3$, $0 \le x < 4$, and $0 \le y < 1$, M is at least one cation, M(II) is at least one divalent cation, M(III) is at least one trivalent cation, H is at least one monovalent anion, and A is a luminescence activator.

29 Claims, 6 Drawing Sheets

US 8,801,969 B2

CARBONITRIDE AND CARBIDONITRIDE PHOSPHORS AND LIGHTING DEVICES USING THE SAME

CROSS-REFERENCE TO RELATED APPLICATIONS

This application claims priority to U.S. Provisional Application No. 61/432,931 filed Jan. 14, 2011, the disclosure of which is hereby incorporated by referenced in its entirety.

STATEMENT REGARDING FEDERALLY FUNDED RESEARCH OR DEVELOPMENT

The present invention was made with government support under grant number 70NANB7H7042 awarded by the National Institute of Standards and Technology under the Advanced Technology Program. Accordingly, the federal government may have certain rights to this invention.

BACKGROUND OF THE INVENTION

In recent years, research and development efforts have been intense on developing combinations of light sources and phosphors that will yield useful, high-performing light emitting devices, with the result that both efficient high-power light sources and efficient phosphors have been demonstrated. For example, both light emitting diode ("LED") chips and phosphors for phosphor-converted LED ("pcLED") devices have been demonstrated. A unique aspect of some phosphor/light source combinations (such as pcLEDs) is that the phosphors are in contact with the light source (such as a LED chip), and the light sources operate at high temperatures. For example, typical junction temperatures of high power LEDs are in the range of 80° C.-150° C. At these temperatures, the crystal of the phosphor is at a high vibrationally excited state, causing the LED excitation energy to be directed to heat emission through lattice relaxation rather than to the desired luminescence emission. Moreover, these lattice relaxations produce further heating, thereby further reducing the luminescence emission. This is a vicious cycle that precludes successful applications of existing phosphor materials. The pcLED lamp for general illumination application requires high optical energy flux (e.g., higher than 1 Watt/mm$^2$) which causes additional heating by a Stokes shift generated inside the phosphor crystals. Successful development of light emitting devices incorporating both phosphors and a light source, such as pcLED lamps for general illumination, therefore requires the development of phosphors that can operate highly efficiently at temperatures of 80° C.-150° C. The risk is that it is difficult both to achieve 90% quantum yield at room temperature and to have high thermal stability at 80° C.-150° C. The thermal stability of a phosphor's luminescence is an intrinsic property of the phosphor which is determined by both the composition and the structure of the crystalline material.

Carbonitride and carbidonitride phosphors have recently been identified as promising candidates for overcoming the above challenges, yielding phosphors have excellent thermal stability and high emission efficiency. However, when combining phosphors with laser diodes to produce white light, a further challenge presents itself: achieving white light of satisfactory hue and color rendering properties. Previously, yellow-emitting phosphors have been used to create white light LED devices, but these devices have not produced desirable, warm white light.

SUMMARY OF THE INVENTION

The phosphors of the present invention comprise yellow and orange-yellow emitting phosphors that are promising candidates for use in white light LED lighting devices. It is typically difficult to manipulate the emission wavelength of phosphors emitting within this spectral range. Advantageously, the phosphors of the present invention are not only thermally stable, but their emission peaks can also be finely tuned by varying the amount of carbon present in the host crystal lattice. This allows for greater flexibility in precisely developing phosphors of a desired wavelength, making it possible, for example, to achieve white light of the desired warmth and color rendering properties.

It is an object of the present invention to provide a phosphor expressed by the formula $M(II)_{m/2}Si_{12-(m+n)-x}C_xM(III)_{m+n}N_{16-n}O_{n-y/2}H_y$:A, wherein $0 \leq m < 5$, $0 \leq n \leq 3$, $0 \leq x < 4$, $0 \leq y < 1$; M(II) is at least one divalent cation; M(III) is at least one trivalent cation; H is at least one monovalent anion; and A is a luminescence activator. In certain embodiments, M(II) is at least one divalent cation selected from the group consisting of Be, Mg, Ca, Sr, Ba, Cu, Co, Ni, Pd, Zn, and Cd; M(III) is at least one trivalent cation selected from the group consisting of B, Al, Ga, In, Sc, Y, La, and Gd; H is at least one monovalent anion selected from the group consisting of F, Cl, Br and I; and A comprises at least one metal ion selected from the group consisting of Ce, Pr, Nd, Sm, Eu, Gd, Tb, Dy, Ho, Er, Tm, Yb, Lu, Mn, Bi, and Sb. In some embodiments, A is doped in the host crystal of the phosphor at a concentration level of about 0.01 mol % to about 20 mol % relative to M(II). In certain embodiments, the phosphor is expressed by the formula $Ca_{m/2}Si_{12-(m+n)-x}C_xAl_{m+n}N_{16-n}O_n$:EU$^{2+}$.

It is a further object of the present invention to provide a phosphor expressed by the formula $M_{m/v}Si_{12-(m+n)-x}C_xM(III)_{m+n}N_{16-n}O_{n-y/2}H_y$:A, wherein v is the valence number of M, $0 \leq m < 5$, $0 \leq n \leq 3$, $0 \leq x < 4$, $0 \leq y < 1$; M is at least one cation; M(III) is at least one trivalent cation; H is at least one monovalent anion; and A is a luminescence activator. In certain embodiments, M is at least one cation selected from the group consisting of Be, Mg, Ca, Sr, Ba, Cu, Co, Ni, Pd, Zn, Cd, Li, Na, K, Rb, Cu, Ag, Au, B, Al, Ga, In, Sc, Y, La, Ce, Pr, Nd, Sm, Eu, Gd, Tb, Dy, Ho, Er, Yb, and Lu; M(III) is at least one trivalent cation selected from the group consisting of B, Al, Ga, In, Sc, Y, La, and Gd; H is at least one monovalent anion selected from the group consisting of F, Cl, Br and I; and A comprises at least one metal ion selected from the group consisting of Ce, Pr, Nd, Sm, Eu, Gd, Tb, Dy, Ho, Er, Tm, Yb, Lu, Mn, Bi, and Sb. In some embodiments, A is doped in the host crystal of the phosphor at a concentration level of about 0.01 mol % to about 20 mol % relative to M(II).

It is a further object of the present invention to provide a phosphor expressed by the formula $M(II)_{m/2}Si_{12-(m+n)+x}M(III)_{m+n-x}N_{16-n-x}C_xO_{n-y/2}H_y$:A, wherein $0 \leq m < 5$, $0 \leq n \leq 3$, $0 \leq x < 4$, $0 \leq y < 1$; M(II) is at least one divalent cation; M(III) is at least one trivalent cation; H is at least one monovalent anion; and A is a luminescence activator. In certain embodiments, M(II) is at least one divalent cation selected from the group consisting of Be, Mg, Ca, Sr, Ba, Cu, Co, Ni, Pd, Zn, and Cd; M(III) is at least one trivalent cation selected from the group consisting of B, Al, Ga, In, Sc, Y, La, and Gd; H is at least one monovalent anion selected from the group consisting of F, Cl, Br and I; and A comprises at least one metal ion selected from the group consisting of Ce, Pr, Nd, Sm, Eu, Gd, Tb, Dy, Ho, Er, Tm, Yb, Lu, Mn, Bi, and Sb. In some embodiments, A is doped in the host crystal of the phosphor at a concentration level of about 0.01 mol % to about 20 mol % relative to M(II). In certain embodiments, the phosphor is expressed by the formula $Ca_{m/2}Si_{12-(m+n)+x}Al_{m+n-x}N_{16-n-x}C_xO_n:Eu^{2+}$.

It is a further object of the present invention to provide a phosphor expressed by the formula $M_{m/v}Si_{12-(m+n)+x}M(III)_{m+n-x}N_{16-n-x}C_xO_{n-y/2}H_y:A$, wherein v is the valence number of M, $0 \leq m < 5$, $0 \leq n \leq 3$, $0 \leq x < 4$, $0 \leq y < 1$; M is at least one cation; M(III) is at least one trivalent cation; H is at least one monovalent anion; and A is a luminescence activator. In certain embodiments, M is at least one cation selected from the group consisting of Be, Mg, Ca, Sr, Ba, Cu, Co, Ni, Pd, Zn, Cd, Li, Na, K, Rb, Cu, Ag, Au, B, Al, Ga, In, Sc, Y, La, Ce, Pr, Nd, Sm, Eu, Gd, Tb, Dy, Ho, Er, Yb, and Lu; M(III) is at least one trivalent cation selected from the group consisting of B, Al, Ga, In, Sc, Y, La, and Gd; H is at least one monovalent anion selected from the group consisting of F, Cl, Br and I; and A comprises at least one metal ion selected from the group consisting of Ce, Pr, Nd, Sm, Eu, Gd, Tb, Dy, Ho, Er, Tm, Yb, Lu, Mn, Bi, and Sb. In some embodiments, A is doped in the host crystal of the phosphor at a concentration level of about 0.01 mol % to about 20 mol % relative to M(II).

It is a further object of the present invention to provide a light emitting device incorporating the phosphors described herein. In certain embodiments, the light emitting device comprises a light source which emits light having a first luminescence spectrum; and a first phosphor which, upon irradiation with light from the light source, emits light having a second luminescence spectrum that is different than the first luminescence spectrum; wherein the first phosphor comprises at least one phosphor expressed by a formula selected from the group consisting of: (a) $M(II)_{m/2}Si_{12-(m+n)-x}C_xM(III)_{m+n}N_{16-n}O_{n-y/2}H_y:A$; (b) $M_{m/v}Si_{12-(m+n)-x}C_xM(III)_{m+n}N_{16-n}O_{n-y/2}H_y:A$; (c) $M(II)_{m/2}Si_{12-(m+n)+x}M(III)_{m+n-x}N_{16-n-x}C_xO_{n-y/2}H_y:A$; and (d) $M_{m/v}Si_{12-(m+n)+x}M(III)_{m+n-x}M(III)_{m+n-x}N_{16-n-x}C_xO_{n-y/2}H_y:A$; wherein v is the valence number of M, $0 \leq m < 5$, $0 \leq n \leq 3$, $0 \leq x < 4$, $0 \leq y < 1$; M(II) is at least one divalent cation; M is at least one cation; M(III) is at least one trivalent cation; H is at least one monovalent anion; and A is a luminescence activator.

In certain embodiments of the light emitting device, M(II) is at least one divalent cation selected from the group consisting of Be, Mg, Ca, Sr, Ba, Cu, Co, Ni, Pd, Zn, and Cd; M is at least one cation selected from the group consisting of Be, Mg, Ca, Sr, Ba, Cu, Co, Ni, Pd, Zn, Cd, Li, Na, K, Rb, Cu, Ag, Au, B, Al, Ga, In, Sc, Y, La, Ce, Pr, Nd, Sm, Eu, Gd, Tb, Dy, Ho, Er, Yb, and Lu; M(III) is at least one trivalent cation selected from the group consisting of B, Al, Ga, In, Sc, Y, La and Gd; H is at least one monovalent anion selected from the group consisting of F, Cl, Br and I; and A comprises at least one metal ion selected from the group consisting of Ce, Pr, Nd, Sm, Eu, Gd, Tb, Dy, Ho, Er, Tm, Yb, Lu, Mn, Bi, and Sb. In certain embodiments, the light emitting device comprises a phosphor expressed by the formula $Ca_{m/2}Si_{12-(m+n)-x}C_xAl_{m+n}N_{16-n}O_n:Eu^{2+}$. In certain embodiments, the light emitting device comprises a phosphor expressed by the formula $Ca_{m/2}Si_{12-(m+n)+x}Al_{m+n-x}N_{16-n-x}C_xO_n:Eu^{2+}$.

In certain embodiments, the first luminescence spectrum of the light emitting device is from about 330 nm to about 500 nm. In certain embodiments, the light source of the light emitting device is a light emitting diode or a laser diode.

In certain embodiments, the light emitting device of the present invention comprises a second phosphor. In some embodiments, the second phosphor comprises one or more of the following phosphors: a red-emitting phosphor, a blue-emitting phosphor, and a green-emitting phosphor. In certain embodiments, the second phosphor is a green-emitting phosphor or a blue-emitting phosphor. In some embodiments, the second phosphor is a green silicate phosphor or a green sulfide phosphor.

In certain embodiments, the light emitting device of the present invention further comprises at least two additional phosphors, wherein said at least two additional phosphors each comprise one or more of the following phosphors: a red-emitting phosphor, a blue-emitting phosphor, and a green-emitting phosphor.

It is a further object of the present invention to provide a light emitting device that emits white light. In certain embodiments, the light emitting device emits warm white light. In certain embodiments, the light emitting device emits cool white light.

DEFINITIONS

As used herein, "activator" refers to the atomic or ionic species that emits light with the support of the host crystal. The activator may be doped in the host crystal in a very small amount, as further described herein.

As used herein, "co-activator" refers to an additional activator in the same host crystal.

As used herein, "dopant" refers to an atomic or ionic species that is doped in a host crystal.

As used herein, "particle" refers to an individual crystal of phosphor.

As used herein, "grain" refers to an agglomeration, aggregation, polycrystalline or polymorph of phosphor particles, where the particles are not easily separated as compared to phosphor particles of a powder.

As used herein, the term "phosphor" refers to a phosphor in any appropriate form, such as a phosphor particle, a phosphor grain, or phosphor powder comprised of phosphor particles, grains, or a combination thereof.

As used herein, "light source" refers to any source of light capable of exciting or irradiating the phosphors of the present invention, including without limitation a Group III-V semiconductor quantum well-based light emitting diode, a laser diode, or a phosphor other than the phosphor of a light emitting device of the present invention. The light source of the present invention can either excite/irradiate the phosphor directly, or excite another system to thereby provide the excitation energy for the phosphor indirectly.

"White light," as used herein, is light of certain chromaticity coordinate values (e.g., Commission Internationale de l'Eclairage (CIE)), which are well-known in the art. Correlated color temperature of a light source is the temperature of an ideal black-body radiator that radiates light of comparable hue to that light source. Higher color temperatures (5,000 K or more) are called cool colors (or "cool white"); lower color temperatures (2,700-3,000 K) are called warm colors (or "warm white").

Unless defined otherwise, all technical and scientific terms used herein have the same meaning as commonly understood by one of ordinary skill in the art to which this invention belongs. All technical and scientific terms used herein have the same meaning when used. It must be noted that, as used herein and in the appended claims, the singular forms "a", "and", and "the" include plural references unless the context clearly dictates otherwise.

In the description of phosphors, a conventional notation is used, wherein the chemical formula for the host crystal is given first, followed by a colon and the formula for the activator(s) and co-activator(s).

DETAILED DESCRIPTION

Figure 1:
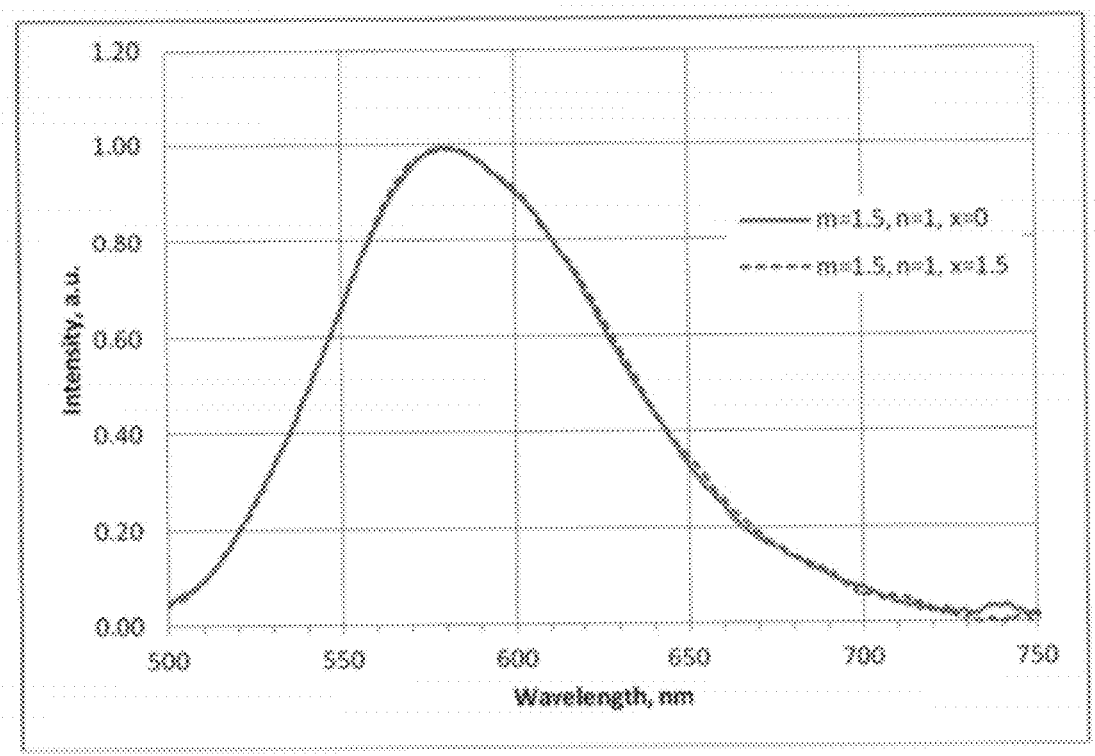
FIG. 1 depicts the luminescent emission spectrum of sample D compared to that of sample A.

In certain embodiments, the present invention is directed to a novel family of phosphors expressed by:

$$Ca_{m/2}Si_{12-(m+n)-x}C_xAl_{m+n}N_{16-n}O_n:Eu^{2+} \quad (0 \leq m < 5, 0 \leq n \leq 3, 0 \leq x < 4) \quad (1)$$

$$M(II)_{m/2}Si_{12-(m+n)-x}C_xM(III)_{m+n-x}N_{16-n}O_{n-y/2}H_y:A \quad (0 \leq m < 5, 0 \leq n \leq 3, 0 \leq x < 4, 0 \leq y < 1) \quad (2)$$

where M(II) is at least one divalent cation, and preferably may be selected from, but not limited to, the group including Be, Mg, Ca, Sr, Ba, Cu, Co, Ni, Pd, Zn, Cd and other divalent transition metal ions. M(III) is at least one trivalent cation, and preferably may be selected from, but not limited to, the group including B, Al, Ga, In, Sc, Y, La and Gd, and other trivalent transition metal ions. H is at least one monovalent anion, and preferably may be selected from, but not limited to, the group including F, Cl, Br and I. A is a luminescence activator doped in the crystal structure at a concentration level of about 0.01 mol % to about 20 mol % relative to the amount of M(II). Preferably, A can be at least one ion selected from the group including Ce, Pr, Nd, Sm, Eu, Gd, Tb, Dy, Ho, Er, Tm, Yb, Lu, Mn, Bi, Sb, more preferably $Ce^{3+}$, $Eu^{2+}$, $Eu^{3+}$, $Tb^{3+}$, $Yb^{2+}$ and $Mn^{2+}$.

In certain embodiments, the present invention is directed to a novel family of phosphors expressed by:

$$M_{m/v}Si_{12-(m+n)-x}C_xM(III)_{m+n}N_{16-n}O_{n-y/2}H_y:A \quad (3)$$

(v is the valence number of M, $0 \leq m < 5$, $0 \leq n \leq 3$, $0 \leq x < 4$, $0 \leq y < 1$)

where M is at least one cation, and preferably may be selected from, but not limited to, the group including (1) divalent cations: Be, Mg, Ca, Sr, Ba, Cu, Co, Ni, Pd, Zn, Cd and other divalent transition metal ions; (2) monovalent cations: Li, Na, K, Rb, Cu, Ag and Au; and (3) trivalent cations: B, Al, Ga, In, Sc, Y, La, Ce, Pr, Nd, Sm, Eu, Gd, Tb, Dy, Ho, Er, Yb, Lu, and other trivalent transition metal ions. M(III) is at least one trivalent cation, and preferably may be selected from, but not limited to, the group including B, Al, Ga, In, Sc, Y, La and Gd, and other trivalent transition metal ions. H is at least one monovalent anion, and preferably may be selected from, but not limited to, the group including F, Cl, Br and I. A is a luminescence activator doped in the crystal structure at a concentration level of about 0.01 mol % to about 20 mol % relative to the amount of M(II). Preferably, A can be at least one ion selected from the group including Ce, Pr, Nd, Sm, Eu, Gd, Tb, Dy, Ho, Er, Tm, Yb, Lu, Mn, Bi, Sb, more preferably $Ce^{3+}$, $Eu^{2+}$, $Eu^{3+}$ $Tb^{3+}$, $Yb^{2+}$ and $Mn^{2+}$.

In certain embodiments, the present invention is directed to a novel family of phosphors expressed by:

$$Ca_{m/2}Si_{12-(m+n)+x}Al_{m+n-x}N_{16-n-x}C_xO_n:Eu^{2+}$$

$(0 \leq m < 5, 0 \leq n \leq 3, 0 \leq x < 4)$ $$M(II)_{m/2}Si_{12-(m+n)+x}M(III)_{m+n-x}N_{16-n-x}C_xO_{n-y/2}H_y:A \quad (5)$$

$(0 \leq m < 5, 0 \leq n \leq 3, 0 \leq x < 4, 0 \leq y < 1)$ where M(II) is at least one divalent cation, and preferably may be selected from, but not limited to, the group including Be, Mg, Ca, Sr, Ba, Cu, Co, Ni, Pd, Zn, Cd and other divalent transition metal ions. M(III) is at least one trivalent cation, and preferably may be selected from, but not limited to, the group including B, Al, Ga, In, Sc, Y, La and Gd, and other trivalent transition metal ions. H is at least one monovalent anion, and preferably may be selected from, but not limited to, the group including F, Cl, Br and I. A is a luminescence activator doped in the crystal structure at a concentration level of about 0.01 mol % to about 20 mol % relative to the amount of M(II). Preferably, A can be at least one ion selected from the group including Ce, Pr, Nd, Sm, Eu, Gd, Tb, Dy, Ho, Er, Tm, Yb, Lu, Mn, Bi, Sb, more preferably $Ce^{3+}$, $Eu^{2+}$, $Eu^{3+}$, $Tb^{3+}$, $Yb^{2+}$ and $Mn^{2+}$.

In certain embodiments, the present invention is directed to a novel family of phosphors expressed by:

$$M_{m/v}Si_{12-(m+n)+x}M(III)_{m+n-x}N_{16-n-x}C_xO_{n-y/2}H_y:A \quad (6)$$

(v is the valence number of M, $0 \leq m < 5$, $0 \leq n \leq 3$, $0 \leq x < 4$, $0 \leq y < 1$)

where M is at least one cation, and preferably may be selected from, but not limited to, the group including (1) divalent cations: Be, Mg, Ca, Sr, Ba, Cu, Co, Ni, Pd, Zn, Cd and other divalent transition metal ions; (2) monovalent cations: Li, Na, K, Rb, Cu, Ag and Au; and (3) trivalent cations: B, Al, Ga, In, Sc, Y, La, Ce, Pr, Nd, Sm, Eu, Gd, Tb, Dy, Ho, Er, Yb, Lu, and other trivalent transition metal ions. H is at least one monovalent anion, and preferably may be selected from, but not limited to, the group including F, Cl, Br and I. A is a luminescence activator doped in the crystal structure at a concentration level of about 0.01 mol % to about 20 mol % relative to the amount of M(II). Preferably, A can be at least one ion selected from the group including Ce, Pr, Nd, Sm, Eu, Gd, Tb, Dy, Ho, Er, Tm, Yb, Lu, Mn, Bi, Sb, more preferably $Ce^{3+}$, $Eu^{2+}$, $Eu^{3+}$, $Tb^{3+}$, $Yb^{2+}$ and $Mn^{2+}$.

In the formulations of the present invention, luminescence activator A can be doped in the crystal structure of the phosphor at a concentration level of about 0.001 mol % to about 10 mol % relative to the divalent cation. In some embodiments, A is doped in the crystal structure of the phosphor at a concentration level of between about 0.1 mol % and about 7 mol % relative to the divalent cation. In other embodiments, A is doped in the crystal structure of the phosphor at a concentration level of between about 0.05 mol % and about 5 mol % relative to the divalent cation. In further embodiments, A is doped in the crystal structure of the phosphor at a concentration level of between about 0.5 mol % and about 2.5 mol % relative to the divalent cation.

In certain embodiments, A comprises at least one co-activator.

In certain embodiments, the phosphors of the present invention emit light having an emission peak wavelength of between about 570 nm and 620 nm when excited with a suitable light source. In some embodiments, the phosphors of the present invention emit light having an emission peak wavelength of between about 575 nm and 610 nm when excited with a suitable light source. In further embodiments, the phosphors of the present invention emit light having an emission peak wavelength of between about 580 nm and 600 nm when excited with a suitable light source.

In certain embodiments, the present invention is directed to a light emitting device comprising a light source which emits light having a first luminescence spectrum, and a first phosphor which, upon irradiation with light from the light source, emits light having a second luminescence spectrum that is different than the first luminescence spectrum; wherein the first phosphor comprises at least one phosphor selected from the phosphors disclosed herein.

In certain embodiments, the light emitting device of the present invention comprises a combination of two or more of the phosphors of the present invention.

In certain embodiments of the light emitting device of the present invention, the first luminescence spectrum is from about 330 nm to about 500 nm.

In further embodiments of the light emitting device, the light source is a light emitting diode or a laser diode.

In certain embodiments of the light emitting device comprises a second phosphor.

In further embodiments of the light emitting device, the second phosphor comprises one or more of the following phosphors: a red-emitting phosphor, a blue-emitting phosphor, a yellow-emitting phosphor, and a green-emitting phosphor. In certain embodiments, the second phosphor is selected from the group consisting of a red-emitting phosphor, a blue-emitting phosphor, a yellow-emitting phosphor, and a green-emitting phosphor.

In some embodiments, the light emitting device comprises a phosphor of the present invention combined with a red-emitting phosphor. In other embodiments, the light emitting device comprises a phosphor of the present invention combined with a blue-emitting phosphor. In other embodiments, the light emitting device comprises a phosphor of the present invention combined with a yellow-emitting phosphor. In other embodiments, the light emitting device comprises a phosphor of the present invention combined with a green-emitting phosphor.

In certain embodiments, the light emitting device of the present invention emits white light. In some embodiments, the light emitting device emits warm white light. In other embodiments, the light emitting device emits cool white light.

In certain embodiments, the median diameter of the phosphor particles of the present invention can be from about 2 to about 50 microns, preferably from about 4 to about 30 microns, and more preferably from about 5 to about 20 microns. In some embodiments, the phosphor is a grain. In other embodiments, the phosphor is a particle.

Figure 4:
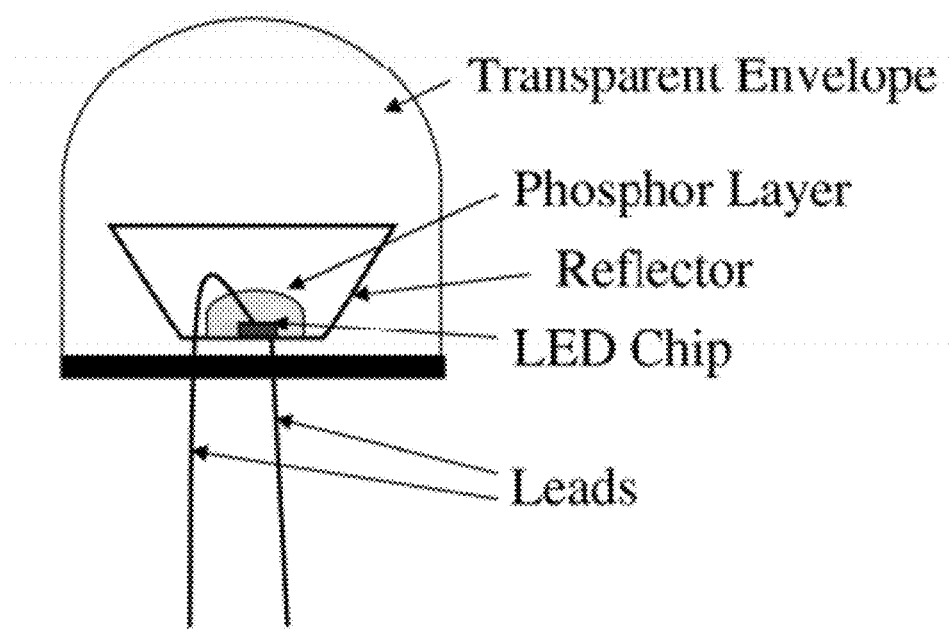
FIG. 4 depicts an embodiment of the light emitting device of the present invention.

In certain embodiments, the present invention further provides a light emitting device comprising: a light source emitting light of wavelengths from about 200 to about 600 nm, preferably from about 350 to about 490 nm; and at least one phosphor of the present invention, where the phosphor is positioned to absorb at least a portion of the light output from the light source and effectively modifies the color of the light absorbed from the light source, resulting in an emission of a longer wavelength than that of the light absorbed from the light source. For example, the phosphors of the present invention are mixed with a silicone resin to form a slurry. The phosphor-filled silicone can be applied to a LED chip as shown in FIG. 4. The LED emits light in the near ultraviolet (nUV) range (e.g., about 405 nm) or the blue range (e.g., about 450 nm).

Figure 5:
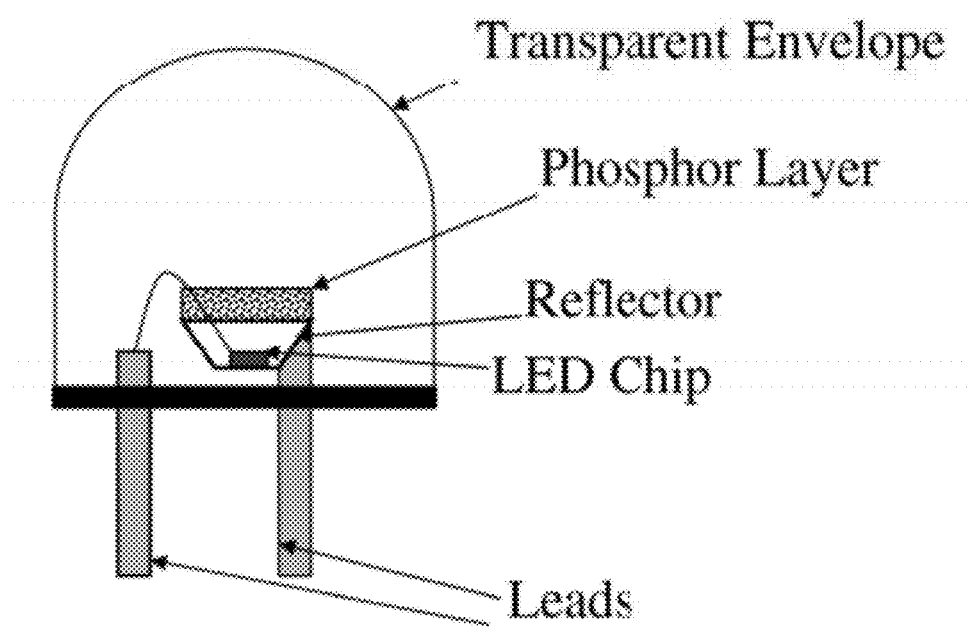
FIG. 5 depicts an embodiment of the light emitting device of the present invention.
Figure 6:
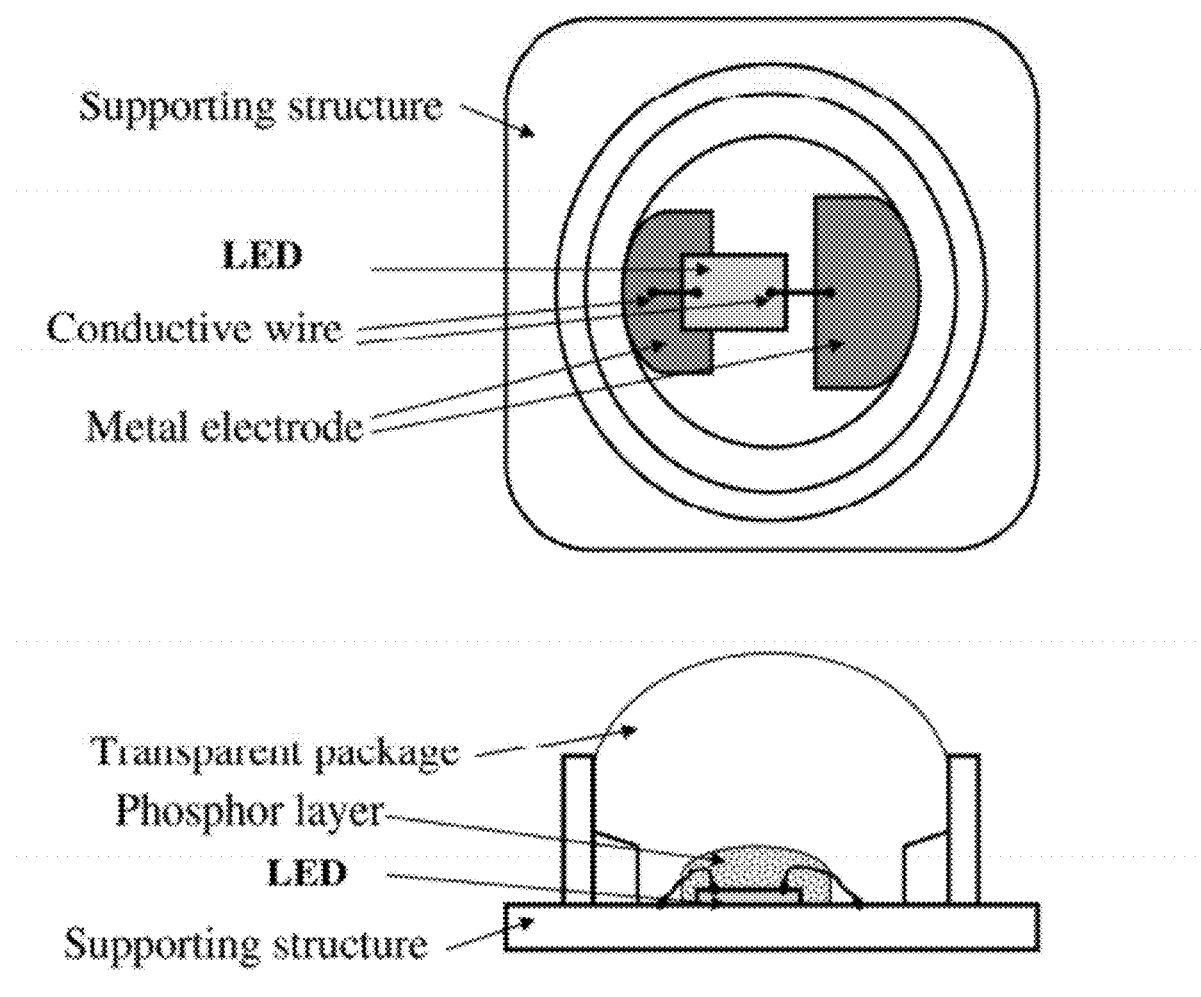
FIG. 6 depicts an embodiment of the light emitting device of the present invention.

The light source used in the present invention, can, for example, comprise a gallium nitride-based LED with a light-emitting layer comprising a quantum well structure. The light emitting device can include a phosphor of the present invention and a reflector located so as to direct light from the LED or the phosphor (see FIGS. 4-6). The phosphor of the present invention can be located on the surface of the LED (FIGS. 4 and 6) or separated therefrom (FIG. 5). The light emitting device can further include a translucent material encapsulating the LED and the phosphor as seen in FIGS. 4-6.

In certain embodiments, the light emitting device of the present invention comprises a light source, such as a LED, to either create excitation energy, or to excite another system to thereby provide the excitation energy for the phosphor of the present invention. Devices using the present invention can include, for example, and without limitation, white light producing light emitting devices, indigo light producing light emitting devices, blue light producing light emitting devices, green light producing light emitting devices, yellow light producing light emitting devices, orange light producing light emitting devices, pink light producing light emitting devices, red light producing light emitting devices, or light emitting devices with an output chromaticity defined by the line between the chromaticity of a phosphor of the present invention and that of at least one second light source. Headlights or other navigation lights for vehicles can be made with the light emitting devices of the present invention. The light emitting devices can be output indicators for small electronic devices, such as cell phones and personal digital assistants (PDAs). The light emitting devices of the present invention also can be the backlights of the liquid crystal displays for TV, cell phones, PDAs and laptop computers. Luminaries for general illumination purpose can also be made with the lighting devices of the present invention. Given appropriate power supplies, room lighting can be based on devices of the invention. The warmth (i.e., amount of yellow/red chromaticity) of light emitting devices of the present invention can be manipulated by selection of the ratio of light from a phosphor of the present invention to light from a second source (including, a second phosphor). Semiconductor light source-based white light devices can be used, for example, in a self-emission type display for displaying a predetermined pattern or a graphic design on a display portion of an audio system, a household appliance, a measuring instrument, a medical appliance, and the like. Such semiconductor light source-based light devices also can be used, for example, and without limitation, as light sources of a back-light for a liquid crystal diode (LCD) display, a printer head, a facsimile, a copying apparatus, and the like.

Suitable semiconductor light sources for use in the present invention also are any that create light that excites the phosphors of the present invention, or that excites a different phosphor that in turn excites the phosphors of the present invention. Such semiconductor light sources can be, for example, and without limitation, light sources including: GaN (gallium nitride) type semiconductor light sources; In—Al—Ga—N type semiconductor light sources, such as $In_iAl_jGa_kN$, where i+j+k=about 1, and where one or more of i, j and k can be 0; BN; SiC; ZnSe; $B_iAl_jGa_kN$, where i+j+k=about 1, and where one or more of i, j, and k can be 0; and $B_iIn_jAl_kGa_lN$, where i+j+k+1=about 1, and where one or more of i, j, k, and 1 can be 0; and other such similar light sources. The semiconductor light source (e.g., a semiconductor chip) can be based, for example, on III-V or II-VI quantum well structures (meaning structures comprising compounds that combine elements of the periodic table of the chemical elements from Group III with those from Group V or elements from Group II with those from Group VI). In certain embodiments, a blue or a near ultraviolet (nUV) emitting semiconductor light source is used.

In certain embodiments, the phosphors of the present invention can be excited by light from a primary light source, such as, for example, a semiconductor light source (e.g., a LED) emitting in the wavelength range of about 300 to about 500 nm, from about 350 nm to about 450 nm or about 330 nm to about 390 nm, or from a secondary light source, such as, emissions from other phosphor(s) that emit in the wavelength range of about 300 nm to about 500 nm or about 350 nm to about 420 nm. Where the excitation light is secondary, in relation to the phosphors of the present invention, the excitation-induced light is the relevant source light. Devices that use the phosphor of the present invention can include, for example, and without limitation, mirrors, such as, dielectric mirrors, which direct light produced by the phosphors of the present invention to the light output, rather than direct such light to the interior of the device (such as, the primary light source).

The light source (e.g., a LED) can, in certain embodiments, emit light of at least about 200 nm, at least about 250 nm, at least about 255 nm, at least about 260 nm, and so on in increments of about 5 nm to at least about 600. The light source can, in certain embodiments, emit light of at most about 600 nm, at most about 595 nm, at most about 590 nm, and so on in increments of about 5 nm to or less than about 200 nm. In certain embodiments, the light source is a semiconductor light source. When LED chips are used, the LED chips are advantageously filled with a transparent encapsulant with a dome-like shape as shown in FIGS. 4 and 5. The encapsulant provides the mechanical protection on one hand, and the encapsulant further improves the optical property on the other hand (improved light emission of the LED die).

The phosphor may be dispersed in an encapsulant. By the encapsulant, the LED chips disposed on the substrate and a polymer lens are bonded without containing a gas as much as possible. The LED die can be sealed directly by the encapsulant. However, it is also possible that the LED die is sealed with a transparent encapsulant (i.e., in this case, there are the transparent encapsulant and the encapsulant to contain the phosphor). Owing to the refraction indices close to each other, there is little loss of reflection at the interface.

In structural modifications, one or more LED chips are disposed on a substrate in a reflection mirror and the phosphor is dispersed in a lens disposed on the reflection mirror. Alternatively, one or more LED chips may be disposed on a substrate in a reflection mirror and the phosphor coated on the reflection mirror.

In certain embodiments of the present invention, phosphors of the present invention can be dispersed in the light emitting device with a binder, a solidifier, a dispersant, a filler or the like. The binder can be, for example, and without limitation, a light curable polymer, such as, an acrylic resin, an epoxy resin, a polycarbonate resin, a silicone resin, a glass, a quartz and the like. The phosphor of the present invention can be dispersed in the binder by methods known in the art. For example, in some cases, the phosphor can be suspended in a solvent with the polymer suspended, thus forming a slurry, which then can be applied on the light emitting device and the solvent evaporated therefrom. In certain embodiments, the phosphor can be suspended in a liquid, such as, a pre-cured precursor to the resin to form a slurry, the slurry then can be dispersed on the light emitting device and the polymer (resin) cured thereon. Curing can be, for example, by heat, UV, or a curing agent (such as, a free radical initiator) mixed with the precursor. As used herein "cure" or "curing" refers to, relates to or is a process for polymerizing or solidifying a substance or mixture thereof, often to improve stability or usability of the substance or mixture thereof. In certain embodiments, the binder used to disperse the phosphor particles in a light emitting device can be liquefied with heat, thereby, a slurry is formed, and then the slurry is dispersed on the light emitting device and allowed to solidify in situ. Dispersants (meaning a substance that promotes the formation and stabilization of a mixture (e.g., a suspension) of one substance into another) include, for example, and without limitation, titanium oxides, aluminum oxides, barium titanates, silicon oxides, and the like.

The polymer lens advantageously has a spherical or oval cavity. The cavity is filled with the encapsulant. As a result, the LED array is fixed at a short distance from the polymer lens. Thereby, the mechanical structure size can be reduced.

In preferred embodiments, the light emitting devices of the present invention comprise two or more different phosphors, and in this case, at least one of the phosphors is a phosphor as disclosed herein. Thereby, the white tone can be particularly adjusted to be accurate. It can be useful to disperse the phosphors separately, and superimpose the phosphors as layers instead of dispersing the phosphors together in one matrix. Alternatively, the phosphors can be intermixed and dispersed in one matrix. Such layering can be used to obtain a final light emission color by way of a plurality of color conversion processes. For example, the light emission process is: absorption of the light emission of a semiconductor light source by a first phosphor of the present invention, light emission by the first phosphor, absorption of the light emission of the first phosphor by a second phosphor, and the light emission by the second phosphor. A similar arrangement can be utilized where there are more than two phosphors. In certain embodiments, at least one of the additional phosphors is also a phosphor of the present invention, and, at least one of the additional phosphors is selected from the following: (1) one or more phosphor compositions that emit green light, including, for example and not limited to, $Ca_{1-x}Sr_xGa_2S_4:Eu^{2+}$ ($0 \le x \le 1$), $Ca_{1-x-y-z}Mg_xSr_yBa_zSiO_4:Eu^{2+}$ ($0 \le x \le 1$, $0 \le y \le 1$, $0 \le z \le 1$, $x+y+z \le 1$), $BaMgAl_{10}O_{17}:Eu^{2+}$, $Mn^{2+}$, $MYSi_4N_7:Eu^{2+}$ (M=Ca, Sr, Ba), $\beta$-sialon:$Eu^{2+}$, $MSi_2O_2N_2:Eu^{2+}$ (M=Mg, Ca, Sr, Ba), $Ba_3Si_6O_{12}N_2:Eu^{2+}$, $M_2Si_5N_8:Ce^{3+}$ (M=Ca, Sr, Ba), $Y_2Si_4N_6C:Ce^{3+}$, and $\alpha$-sialon:$Yb^{2+}$, (2) one or more phosphor compositions that emit blue light, including, for example and not limited to, $(MSiO_3)_m \cdot (SiO_2)_n:Eu^{2+}$, X (M=Mg, Ca, Sr, Ba; X=F, Cl, Br, I), where m is 1 or 0, and either (i) n>3 if m=1 or (ii) n=1 if m=0, $MAl_2O_4:Eu^{2+}$ (M=Mg, Ca, Sr, Ba), and $BaMgAl_{10}O_{17}:Eu^{2+}$, (3) one or more phosphor compositions that emit red light, including, for example and not limited to, $Ca_{1-x}Sr_xS:Eu^{2+}$ ($0 \le x \le 1$), $3.5MgO \cdot 0.5MgF_2 \cdot GeO_2:Mn^{4+}$, $Y_2O_2S:Eu^{3+}$, $M_2Si_5N_8:Eu^{2+}$ (M=Ca, Sr, Ba), $MAlSiN_3:Eu^{2+}$ (M=Ca, Sr), $Y_2Si_4N_6C:Eu^{2+}$, and $CaSiN_2:Eu^2$.

In the case that multiple phosphors are used, it may be advantageous that the multiple phosphors are suspended in each matrix, and, in that case, these matrices are disposed back and forth in the light propagation direction. Thereby, the matrix concentration can be reduced compared with the case that the different phosphors are dispersed and mixed together.

EXAMPLES

Example 1

Preparation of $Ca_{m/2}Si_{12-m-n+x}Al_{m+n-x}N_{16-n-x}C_xO_n:Eu$

The samples of phosphor composition $Ca_{m/2}Si_{12-m+x}Al_{m+n-x}N_{16-n-x}C_xO_n:Eu$ were prepared by a solid state reaction with the starting materials of the calcium carbonate, silicon nitride, aluminum nitride, silicon carbide, europium oxide ($Eu_2O_3$) and silicon oxide. The starting materials were weighed out in designed amounts listed in Table 1 and then mixed and/or ground. Subsequently, the powder mixture was fired at 1600-1850° C. for about 4-8 hours in a high temperature furnace under $N_2/H_2$ atmosphere. After firing, the product was ground and sieved, and washed with water.

The preparations of this example involve a step-wise increase in the amount of SiC in the starting materials. The addition of SiC to the starting materials facilitates an increase in the amount of $C^{-4}$ substitution on the $N^{-3}$ site along with the substitution of $Al^{3+}$ with $Si^{4+}$ simultaneously within the lattice of the host crystal's structure, and results in increasing amounts of carbon in the phosphor product.

The luminescence properties of the phosphor products are listed in Table 2. As can be seen, the emission wavelength of the prepared phosphors decreases as the value of x (i.e., the SiC content) increases. It is noted that the amount of carbon incorporated into the formulation is impacted, in part, by the temperature at which the starting materials are fired. Accordingly, it may be possible to increase the carbon content by firing at higher temperatures in the preparation process.

TABLE 1

Weight amount of raw materials for preparing composition $Ca_{m/2}Si_{12-m-n+x}Al_{m+n-x}N_{16-n-x}C_xO_n$:Eu

| Sample ID | $CaCO_3$ | $Si_3N_4$ | AlN | $SiO_2$ | $Eu_2O_3$ | SiC |
|---|---|---|---|---|---|---|
| A | 0.455 g | 2.931 g | 0.685 g | 0.050 g | 0.082 g | 0 |
| B | 0.451 g | 2.747 g | 0.678 g | 0.050 g | 0.082 g | 0.133 g |
| C | 0.446 g | 2.567 g | 0.672 g | 0.049 g | 0.081 g | 0.263 g |
| D | 0.442 g | 2.390 g | 0.049 g | 0.665 g | 0.080 g | 0.390 g |

TABLE 2

Luminescence properties of $Ca_{m/2}Si_{12-m-n+x}Al_{m+n-x}N_{16-n-x}C_xO_n$:Eu

| Sample ID | $\lambda_{ex}$, nm | FWHM, nm | $\lambda_{ex}$, nm | QE, % | Formulation coefficients |
|---|---|---|---|---|---|
| A | 406 | 94 | 580 | 81% | x = 0, m = 1.5, n = 1 |
| B | 406 | 93 | 579 | 75% | x = 0.5, m = 1.5, n = 1 |
| C | 406 | 93 | 577 | 60% | x = 1, m = 1.5, n = 1 |
| D | 406 | 93 | 583 | 63% | x = 1.5, m = 1.5, n = 1 |

Example 2

Preparation of $Ca_{m/2}Si_{12-m-n+x}Al_{m+n-x}N_{16-n-x}C_xO_n$:Eu and $Ca_{m/2}Si_{12-(m+n)-x}C_xAl_{m+n}N_{16-n}O_n$:Eu Similar to the preparation in Example 1, the samples of phosphor composition $Ca_{m/2}Si_{12-m-n+x}Al_{m+n-x}N_{16-n-x}C_xO_n$:Eu were prepared by a solid state reaction with the starting materials of calcium carbonate, silicon nitride, sugar charcoal (C), aluminum nitride, europium oxide ($Eu_2O_3$) and silicon oxide. The starting materials were weighed out in designed amounts listed in Table 3 and then mixed and/or ground. Subsequently, the powder mixture was fired at 1600-1850° C. for about 4-8 hrs in a high temperature furnace under $N_2/H_2$ atmosphere. After firing, the product was ground and sieved, and washed with water. The luminescence properties of the phosphor products are listed in Table 4.

For comparison, a sample of phosphor composition represented by the formula $Ca_{m/2}Si_{12-(m+n)-x}C_xAl_{m+n}N_{16-n}O_n$:Eu was synthesized by a solid state reaction using carbon nitride (a source of carbon cations) instead of sugar charcoal (a source of carbon anions), with the starting materials of the calcium carbonate, silicon nitride, aluminum nitride, carbon nitride ($C_3N_4$), europium oxide ($Eu_2O_3$) and silicon oxide. The starting materials were weighed out in designed amounts listed in Table 3 and then mixed and/or ground. Subsequently, the powder mixture was fired at 1600-1850° C. for about 4-8 hrs in a high temperature furnace under $N_2/H_2$ atmosphere. After firing, the product was ground and sieved, and washed with water. The luminescence properties of the phosphor product are listed in Table 4.

As can be seen, the phosphor prepared with $C_3N_4$ exhibited a higher quantum efficiency than those prepared with sugar charcoal, with quantum efficiency dropping as more sugar charcoal was added to the starting materials.

TABLE 3

Weight amount of raw materials for preparing composition $Ca_{m/2}Si_{12-m-n+x}Al_{m+n-x}N_{16-n-x}C_xO_n$:Eu and composition $Ca_{m/2}Si_{12-(m+n)-x}C_xAl_{m+n}N_{16-n}O_n$:Eu

| Sample ID | $CaCO_3$ | $Si_3N_4$ | AlN | $SiO_2$ | $Eu_2O_3$ | $C_3N_4$ | Sugar Charcoal |
|---|---|---|---|---|---|---|---|
| E | 0.630 g | 2.892 g | 0.922 g | 0.068 g | 0.079 g | 0 | 0.270 g |
| F | 0.613 g | 3.219 g | 0.896 g | 0.066 g | 0.077 g | 0 | 0.160 g |
| G | 0.592 g | 3.604 g | 0.865 g | 0.063 g | 0.074 g | 0.065 g | 0 |

TABLE 4

Luminescence properties of $Ca_{m/2}Si_{12-m-n+x}Al_{m+n-x}N_{16-n-x}C_xO_n$:Eu and composition $Ca_{m/2}Si_{12-(m+n)-x}C_xAl_{m+n}N_{16-n}O_n$:Eu

| Sample ID | $\lambda_{ex}$, nm | FWHM, nm | $\lambda_{ex}$, nm | QE, % | Formulation parameters |
|---|---|---|---|---|---|
| E | 406 | 93 | 589 | 67% | C sugar charcoal |
| F | 406 | 93 | 586 | 83% | C sugar charcoal |
| G | 406 | 92 | 586 | 85% | $C_3N_4$ |

Example 3

Preparation of phosphor $Ca_{m/2}Si_{12-(m-n)-x}C_xAl_{m+n}N_{16-n}O_n$:Eu

The samples of phosphor composition $Ca_{m/2}Si_{12-(m+n)-x}C_xAl_{m+n}N_{16-n}O_n$:Eu were prepared by a solid state reaction with the starting materials of the calcium carbonate, silicon nitride, carbonitride ($C_3N_4$), europium oxide ($Eu_2O_3$) and silicon oxide. The starting materials were weighed out in designed amounts listed in Table 5 and then mixed and/or ground. Subsequently, the powder mixture was fired at 1600-1850° C. for about 4-8 hrs in a high temperature furnace under N₂/H₂ atmosphere. After firing, the product was ground and sieved, and washed with water.

The preparations of this example involve a step-wise increase in the amount of $C_3N_4$ in the starting materials. The addition of $C_3N_4$ to the starting materials facilitates an increase in the amount of $C^{+4}$ substitution on the $Si^{+4}$ site within the lattice of the host crystal's structure, resulting in increasing amounts of carbon in the phosphor product.

Figure 2:
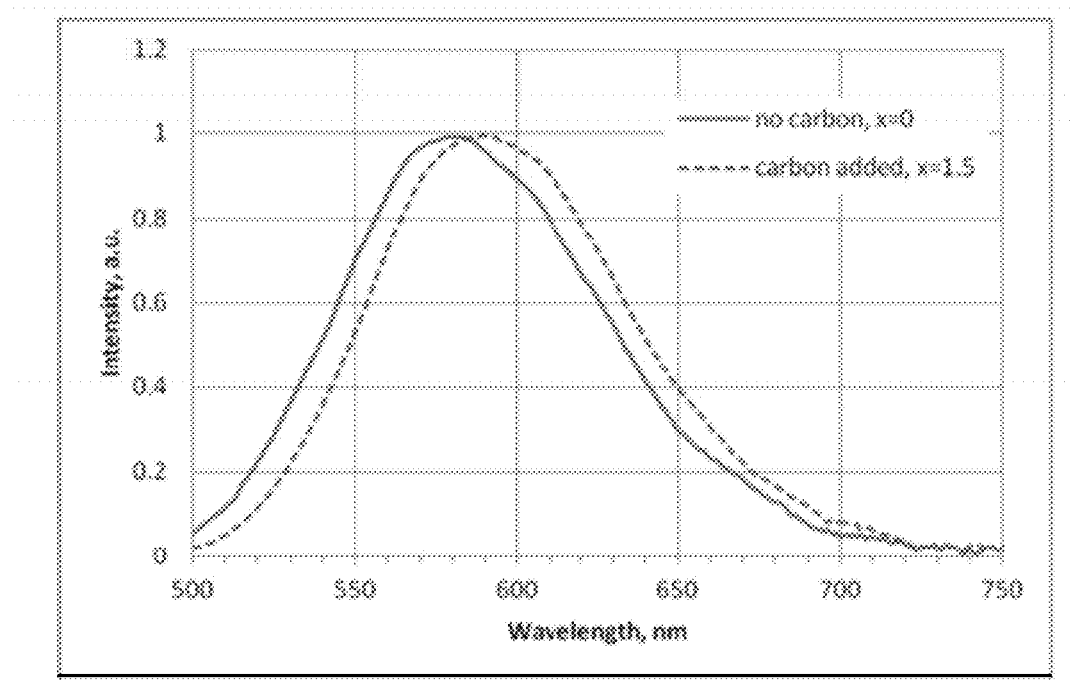
FIG. 2 depicts the luminescent emission spectrum of sample J (with carbon, x=1.5) compared to that of sample H (without carbon, x=0).
Figure 3:
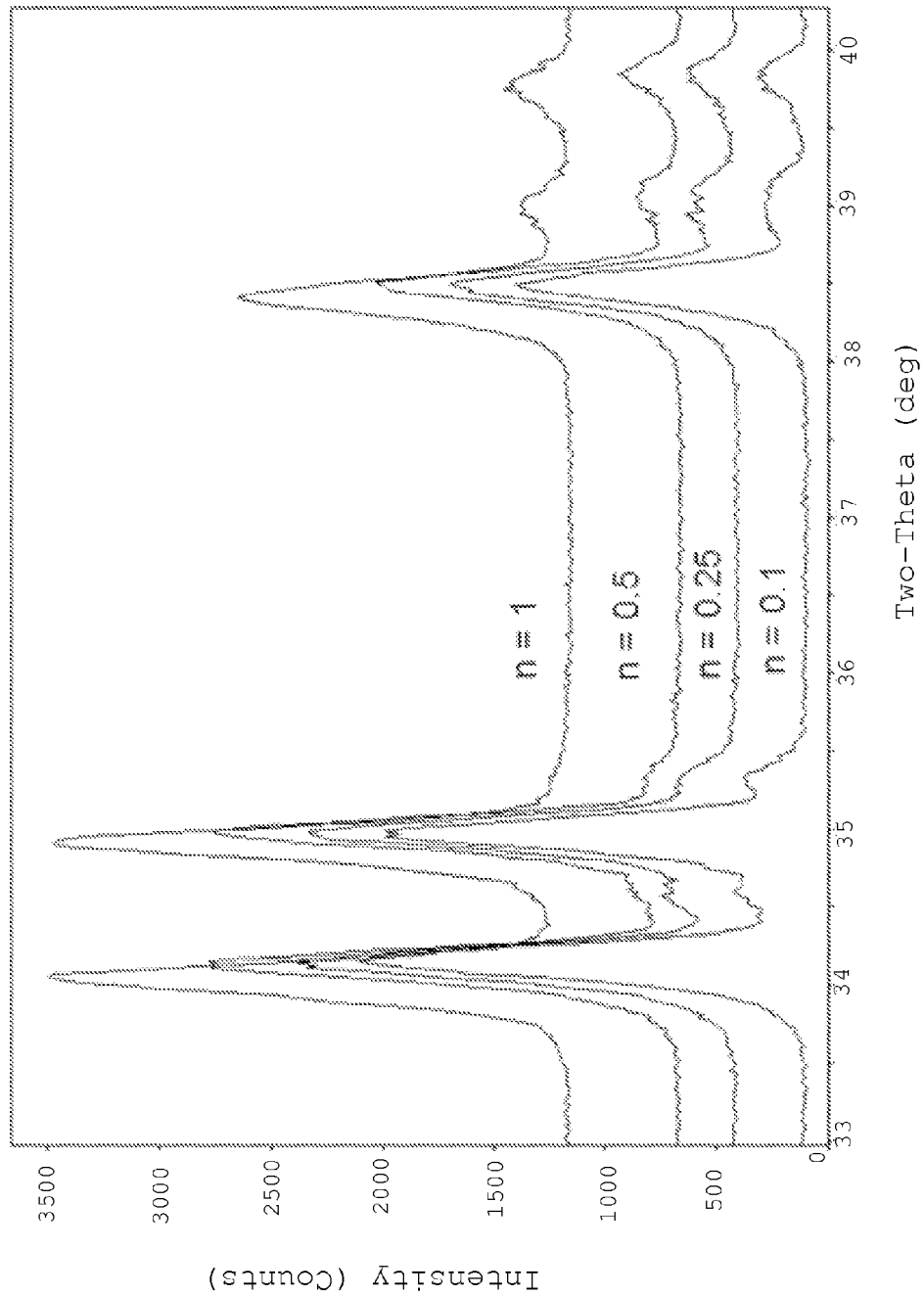
FIG. 3 depicts the XRD patterns of phosphor samples H (top), I (middle), and J (bottom).

The formulation coefficients of the resultant phosphor products are listed in Table 6. The luminescent emission of the sample J (x=1.5, i.e., carbon-containing) is compared with that of H (x=0, i.e., no carbon) in FIG. 2. As shown in FIG. 2, the wavelength of the phosphor's emission peak is shifted as the amount of carbon in the formulation increases, adding greater flexibility to achieving precise phosphor emissions as needed. The emission spectrum of sample I (not shown) fell between the two peaks shown in FIG. 2, further demonstrating this trend. The XRD patterns of the phosphor samples of H, I and J are shown in FIG. 3. As can be seen from FIG. 3, the value of 2-theta increases as the amount of carbon in the formulation increases.

TABLE 5

Weight amount of raw materials for preparing composition
$Ca_{m/2}Si_{12-(m+n)-x}C_xAl_{m+n}N_{16-n}O_n$:Eu

| Sample ID | CaCO3 | Si₃N₄ | AlN | Eu₂O₃ | C₃N₄ |
|---|---|---|---|---|---|
| H | 0.613 | 2.770 | 0.809 | 0.081 | 0.000 |
| I | 0.604 | 2.732 | 0.798 | 0.080 | 0.139 |
| J | 0.595 | 2.690 | 0.786 | 0.079 | 0.294 |

TABLE 6

Formulation coefficients of the phosphor composition
$Ca_{m/2}Si_{12-(m+n)-x}C_xAl_{m+n}N_{16-n}O_n$:Eu

| Sample ID | m | n | z | x | Ca | Eu | Si | Al | C | N | O |
|---|---|---|---|---|---|---|---|---|---|---|---|
| H | 2 | 1 | 0.07 | 0 | 0.93 | 0.07 | 9.0 | 3.0 | 0.0 | 15.0 | 1.0 |
| I | 2 | 1 | 0.07 | 0.7 | 0.93 | 0.07 | 8.3 | 3.0 | 0.7 | 15.0 | 1.0 |
| J | 2 | 1 | 0.07 | 1.5 | 0.93 | 0.07 | 7.5 | 3.0 | 1.5 | 15.0 | 1.0 |

The present invention is not to be limited in scope by the specific embodiments disclosed in the examples, which are intended as illustrations of a few aspects of the invention, and any embodiments that are functionally equivalent are within the scope of this invention. Indeed, various modifications of the invention in addition to those shown and described herein will become apparent to those skilled in the art and are intended to fall within the scope of the appended claims.

What is claimed:

1. A phosphor expressed by the formula $$M(II)_{m/2}Si_{12-(m+n)-x}C_xM(III)_{m+n}N_{16-n}O_{n-y/2}H_y:A,$$

wherein:
  0≤m<5, 0≤n≤3, 0≤x<4, 0≤y<1;
  M(II) is at least one divalent cation;
  M(III) is at least one trivalent cation;
  H is at least one monovalent anion; and
  A is a luminescence activator.

2. The phosphor of claim 1, wherein:
  M(II) is at least one divalent cation selected from the group consisting of Be, Mg, Ca, Sr, Ba, Cu, Co, Ni, Pd, Zn, and Cd;
  M(III) is at least one trivalent cation selected from the group consisting of B, Al, Ga, In, Sc, Y, La, and Gd;
  H is at least one monovalent anion selected from the group consisting of F, Cl, Br and I; and
  A comprises at least one metal ion selected from the group consisting of Ce, Pr, Nd, Sm, Eu, Gd, Tb, Dy, Ho, Er, Tm, Yb, Lu, Mn, Bi, and Sb.

3. The phosphor of claim 1, wherein A is doped in the host crystal of the phosphor at a concentration level of about 0.01 mol % to about 20 mol % relative to M(II).

4. The phosphor of claim 1, expressed by the formula $$Ca_{m/2}Si_{12-(m+n)-x}C_xAl_{m+n}N_{16-n}O_n:Eu^{2+}.$$

5. A phosphor expressed by the formula $M_{m/v}Si_{12-(m+n)-x}C_xM(III)_{m+n}N_{16-n}O_{n-y/2}H_y:A$, wherein:
  v is the valence number of M, 0≤m<5, 0≤n≤3, 0≤x<4, 0≤y<1;
  M is at least one cation;
  M(III) is at least one trivalent cation;
  H is at least one monovalent anion; and
  A is a luminescence activator.

6. The phosphor of claim 5, wherein:
  M is at least one cation selected from the group consisting of Be, Mg, Ca, Sr, Ba, Cu, Co, Ni, Pd, Zn, Cd, Li, Na, K, Rb, Cu, Ag, Au, B, Al, Ga, In, Sc, Y, La, Ce, Pr, Nd, Sm, Eu, Gd, Tb, Dy, Ho, Er, Yb, and Lu;
  M(III) is at least one trivalent cation selected from the group consisting of B, Al, Ga, In, Sc, Y, La, and Gd;
  H is at least one monovalent anion selected from the group consisting of F, Cl, Br and I; and
  A comprises at least one metal ion selected from the group consisting of Ce, Pr, Nd, Sm, Eu, Gd, Tb, Dy, Ho, Er, Tm, Yb, Lu, Mn, Bi, and Sb.

7. The phosphor of claim 5, wherein A is doped in the host crystal of the phosphor at a concentration level of about 0.01 mol % to about 20 mol % relative to M(II).

8. A phosphor expressed by the formula $$M(II)_{m/2}Si_{12-(m+n)+x}M(III)_{m+n-x}N_{16-n-x}C_xO_{n-y/2}H_y:A,$$

wherein:
  0≤m<5, 0≤n≤3, 0≤x<4, 0≤y<1;
  M(II) is at least one divalent cation;
  M(III) is at least one trivalent cation; and
  H is at least one monovalent anion
  A is a luminescence activator.

9. The phosphor of claim 8, wherein:
  M(II) is at least one divalent cation selected from the group consisting of Be, Mg, Ca, Sr, Ba, Cu, Co, Ni, Pd, Zn, and Cd;
  M(III) is at least one trivalent cation selected from the group consisting of B, Al, Ga, In, Sc, Y, La, and Gd;
  H is at least one monovalent anion selected from the group consisting of F, Cl, Br and I; and
  A comprises at least one metal ion selected from the group consisting of Ce, Pr, Nd, Sm, Eu, Gd, Tb, Dy, Ho, Er, Tm, Yb, Lu, Mn, Bi, and Sb.

10. The phosphor of claim 8, wherein A is doped in the host crystal of the phosphor at a concentration level of about 0.01 mol % to about 20 mol % relative to M(II).

11. The phosphor of claim 8, expressed by the formula $$Ca_{m/2}Si_{12-(m+n)+x}Al_{m+n-x}N_{16-n-x}C_xO_n:Eu^{2+}.$$

12. A phosphor expressed by the formula $$M_{m/v}Si_{12-(m+n)+x}M(III)_{m+n-x}N_{16-n-x}C_xO_{n-y/2}H_y:A,$$

wherein:
  v is the valence number of M, 0≤m<5, 0≤n≤3, 0≤x<4, 0≤y<1;

M is at least one cation;
M(III) is at least one trivalent cation;
H is at least one monovalent anion; and
A is a luminescence activator.

13. The phosphor of claim 12, wherein:
M is at least one cation selected from the group consisting of Be, Mg, Ca, Sr, Ba, Cu, Co, Ni, Pd, Zn, Cd, Li, Na, K, Rb, Cu, Ag, Au, B, Al, Ga, In, Sc, Y, La, Ce, Pr, Nd, Sm, Eu, Gd, Tb, Dy, Ho, Er, Yb, and Lu;
M(III) is at least one trivalent cation selected from the group consisting of B, Al, Ga, In, Sc, Y, La, and Gd;
H is at least one monovalent anion selected from the group consisting of F, Cl, Br and I; and
A comprises at least one metal ion selected from the group consisting of Ce, Pr, Nd, Sm, Eu, Gd, Tb, Dy, Ho, Er, Tm, Yb, Lu, Mn, Bi, and Sb.

14. The phosphor of claim 12, wherein A is doped in the host crystal of the phosphor at a concentration level of about 0.01 mol % to about 20 mol % relative to M(II).

15. A light emitting device comprising:
a light source which emits light having a first luminescence spectrum; and
a first phosphor which, upon irradiation with light from the light source, emits light having a second luminescence spectrum that is different than the first luminescence spectrum;
wherein the first phosphor comprises at least one phosphor expressed by a formula selected from the group consisting of:

$$M(II)_{m/2}Si_{12-(m+n)-x}C_xM(III)_{m+n}N_{16-n}O_{n-y/2}H_y:A; \quad (a)$$

$$M_{m/v}Si_{12-(m-m)-x}C_xM(III)_{m+n}N_{16-n}O_{n-y/2}H_y:A; \quad (b)$$

$$M(II)_{m/2}Si_{12-(m+n)+x}M(III)_{m+n-x}N_{16-n-x}C_xO_{n-y/2}H_y:A; \text{ and} \quad (c)$$

$$M_{m/v}Si_{12-(m+n)+x}M(III)_{m+n-x}N_{16-n-x}C_xO_{n-y/2}H_y:A; \quad (d)$$

wherein:
v is the valence number of M, $0 \leq m < 5$, $0 \leq n \leq 3$, $0 \leq x < 4$, and $0 \leq y < 1$;
M(II) is at least one divalent cation;
M is at least one cation;
M(III) is at least one trivalent cation;
H is at least one monovalent anion; and
A is a luminescence activator.

16. The light emitting device of claim 15, wherein:
M(II) is at least one divalent cation selected from the group consisting of Be, Mg, Ca, Sr, Ba, Cu, Co, Ni, Pd, Zn, and Cd;
M is at least one cation selected from the group consisting of Be, Mg, Ca, Sr, Ba, Cu, Co, Ni, Pd, Zn, Cd, Li, Na, K, Rb, Cu, Ag, Au, B, Al, Ga, In, Sc, Y, La, Ce, Pr, Nd, Sm, Eu, Gd, Tb, Dy, Ho, Er, Yb, and Lu;
M(III) is at least one trivalent cation selected from the group consisting of B, Al, Ga, In, Sc, Y, La and Gd;
H is at least one monovalent anion selected from the group consisting of F, Cl, Br and I; and
A comprises at least one metal ion selected from the group consisting of Ce, Pr, Nd, Sm, Eu, Gd, Tb, Dy, Ho, Er, Tm, Yb, Lu, Mn, Bi, and Sb.

17. The light emitting device of claim 15, wherein the phosphor is expressed by the formula $Ca_{m/2}Si_{12-(m+n)-x}C_xAl_{m+n}N_{16-n}O_n:Eu^{2+}$.

18. The light emitting device of claim 15, wherein the phosphor is expressed by the formula $Ca_{m/2}Si_{12-(m+n+x)}Al_{m+n-x}N_{16-n-x}C_xO_n:Eu^{2+}$.

19. The light emitting device of claim 15, wherein the first luminescence spectrum is from about 330 nm to about 500 nm.

20. The light emitting device of claim 15, wherein the light source is a light emitting diode or a laser diode.

21. The light emitting device of claim 15, further comprising a second phosphor.

22. The light emitting device of claim 21, wherein the second phosphor is a red-emitting phosphor, a blue-emitting phosphor, or a green-emitting phosphor.

23. The light emitting device of claim 21, wherein the second phosphor is a green-emitting phosphor or a blue-emitting phosphor.

24. The light emitting device of claim 21, wherein the second phosphor is a green silicate phosphor or a green sulfide phosphor.

25. The light emitting device of claim 15, further comprising at least two additional phosphors, wherein said at least two additional phosphors each comprise one or more of the following phosphors: a red-emitting phosphor, a blue-emitting phosphor, and a green-emitting phosphor.

26. The light emitting device of claim 15, wherein the light emitting device emits white light.

27. The light emitting device of claim 21, wherein the light emitting device emits white light.

28. The light emitting device of claim 26, wherein the light emitting device emits warm or cool white light.

29. The light emitting device of claim 27, wherein the light emitting device emits warm or cool white light.

* * * * *